United States Patent
Pandey et al.

(10) Patent No.: US 10,831,972 B2
(45) Date of Patent: *Nov. 10, 2020

(54) CAPACITY MODEL FOR GLOBAL ROUTING

(71) Applicant: International Business Machines Corporation, Armonk, NY (US)

(72) Inventors: Diwesh Pandey, Bangalore (IN); Christian Schulte, Boeblingen (DE); Gustavo E Tellez, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/664,899

(22) Filed: Oct. 27, 2019

(65) Prior Publication Data

US 2020/0057835 A1  Feb. 20, 2020

Related U.S. Application Data

(63) Continuation of application No. 16/240,719, filed on Jan. 5, 2019, which is a continuation of application No. 15/477,659, filed on Apr. 3, 2017, now Pat. No. 10,229,239.

(51) Int. Cl.
*G06F 30/394* (2020.01)

(52) U.S. Cl.
CPC .................. *G06F 30/394* (2020.01)

(58) Field of Classification Search
CPC ............ G06F 17/5077; G06F 17/5072; G06F 17/5081; G06F 17/5068; G06F 2217/12; G06F 2217/06; G06F 2217/78; G06F 30/394; G06F 30/392; G06F 30/398; G06F 2119/18; G06F 30/39; G06F 2111/04;
(Continued)

(56) References Cited

U.S. PATENT DOCUMENTS 6,378,121 B2  4/2002  Hiraga
8,407,647 B2  3/2013  Chang
(Continued)

OTHER PUBLICATIONS

C-H Hsu et al., "Global Routing with Via/Wire Capacity Considerations", eda.ee.ntu.edu.tw.
(Continued)

*Primary Examiner* — Nha T Nguyen
(74) *Attorney, Agent, or Firm* — Jeffrey S LaBaw; Steven J Meyers

(57) ABSTRACT

A global router determines edge capacity of global tiles for a first integrated circuit in a global routing operation. The global router determines a respective edge capacity of first width wire tracks for each of a plurality of global tiles in a first metal layer in the first integrated circuit in a first global routing operation. The global router determines a respective edge capacity of second width wire tracks for each of the plurality of global tiles in the first metal layer in the first integrated circuit in a second global routing operation. The edge capacities for first width and second width wire tracks are determined in separate operations by the global router as part of the operations performed for fabrication of the first integrated circuit.

17 Claims, 10 Drawing Sheets

(58) Field of Classification Search
CPC ...... G06F 2119/06; G06F 30/00; G06F 30/13; G06F 30/18; G06F 30/327; G06F 30/33
See application file for complete search history.

(56) References Cited

U.S. PATENT DOCUMENTS

| | | | |
|---|---|---|---|
| 8,984,465 B1* | 3/2015 | Salowe | G06F 30/392 |
| | | | 716/122 |
| 9,372,955 B1 | 6/2016 | Lee | |
| 9,390,216 B2* | 7/2016 | Ding | G06F 30/394 |
| 9,563,737 B1 | 2/2017 | Arkhipov | |
| 9,904,756 B1 | 2/2018 | Ruehl | |
| 2011/0014786 A1 | 1/2011 | Sezginer | |
| 2015/0286764 A1 | 10/2015 | Yuan | |
| 2017/0277818 A1 | 9/2017 | Dai | |
| 2017/0300608 A1 | 10/2017 | Narisetty | |
| 2018/0004883 A1 | 1/2018 | Yuan | |

OTHER PUBLICATIONS

C-H Hsu et al., "Multi-layer Global Routing Considering Via and Wire Capacities," IEEE/ACM International Conference on Computer-Aided Design, 2008.
List of IBM Patents or Patent Applications Treated as Related.

* cited by examiner

CAPACITY MODEL FOR GLOBAL ROUTING

BACKGROUND OF THE INVENTION

This disclosure relates to integrated circuit devices. More specifically, to designing interconnect wiring structures in semiconductor devices.

Integrated circuits are fashioned by creating a plurality of devices in a substrate which are interconnected by multiple layers of interconnections. The process starts with a chip designer constructing the layout of a new chip design with the use of an electronic design automation (EDA) tool. One of the tasks automated by such tools is the wire routing, or simply routing, of the wiring between devices within the available space allocated to the metal layers and the vias which interconnect the metal layers. Speed in the design process is an important criterion for an EDA system. Design tools which provide rapid, accurate results, especially for large complex designs are valuable so that designers can make decisions quickly on design tradeoffs without needing to wait for days to even weeks to obtain accurate results from the system.

It is typical that the routing process used by an EDA tool contains a global routing phase and a detail routing phase. Global routing in modern circuit design is used to establish an approximate route of the wiring between devices. Detailed routing will follow the global routing and route the actual wires to the devices. The global routing is simpler than the detail routing problem, because it does not see many of the small details that detail routing has to solve. Therefore, it has several advantages including that global routing is much faster than detail routing. Further, global routing can be designed in such a way that its results are "provably optimal", in other words, it has some quality guarantees. Global routing is used as guidance for detail routing, e.g., used for wire resource allocation and fast estimation purposes. It is desirable that the global routing be as accurate as possible to minimize computations needed in the rip-up and reroute step.

The capacity model used in the typical state of the art router uses a simplified measure of the wiring capacities between tiles in the same metal layer. When modelling integrated circuits for future semiconductor processing technologies, such as the Self Aligned Double Patterning (SADP) manufacturing process, the simple capacity model has major flaws.

The present disclosure presents an advanced electronic design mechanism to alleviate these problems.

BRIEF SUMMARY

According to this disclosure, a global router determines edge capacity of global tiles for a first integrated circuit in a global routing operation. The global router determines a respective edge capacity of first width wire tracks for each of a plurality of global tiles in a first metal layer in the first integrated circuit in a first global routing operation. The global router determines a respective edge capacity of second width wire tracks for each of the plurality of global tiles in the first metal layer in the first integrated circuit in a second global routing operation. The edge capacities for first width and second width wire tracks are determined in separate operations by the global router as part of the operations performed for fabrication of the first integrated circuit.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

At a high level, embodiments of the invention provide edge capacities for minimum width and non-minimum width wire tracks in a global routing phase in separate operations.

The capacity model used in the typical state of the art router uses a simplified measure of the wiring capacities between tiles in the same metal layer and the wiring capacities of the vias which interconnect the metal layers. In future technologies, such as the Self Aligned Double Patterning (SADP) manufacturing process, the simple capacity model has major flaws. The total wire capacity is modeled with respect to a single default wire usage which is not accurate. The simple capacity model does not consider regional wire track patterns. It works with overlapping track patterns. This is a problem with the new SADP technology, where the overlapping track patterns are not used. The simple capacity model or other existing methods, assigns uniform track patterns in the whole design without considering specific regions. In SADP, track patterns are associated to specific regions and the router only route specific wires which are legal to place in that region.

Embodiments will be explained below with reference to the accompanying drawings.

Figure 1:
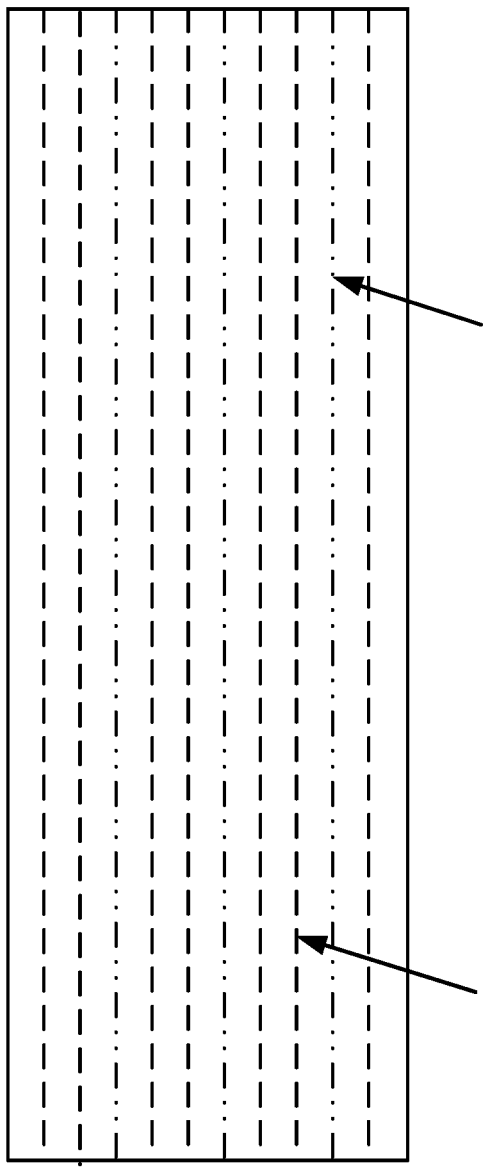
FIG. 1 is a top diagram depicting a tile in a circuit design disposed on a substrate according to a prior art routing mechanism.

FIG. 1 is a top diagram depicting a tile in a circuit design disposed on a substrate according to a prior art routing mechanism. As shown in FIG. 1, track patterns are created for each wire width type to meet the design rules criteria. In embodiments which follow this type of design criteria, track patterns are not limited to a region. Different types of track patterns can be arbitrarily close to each other. In the prior art, the router has enough freedom to decide where to use wide or narrow wires, as they can always be interleaved without any order. For ease in illustration and explanation, only two types of wire tracks are shown, single thickness wire tracks by the dashed lines and a double thickness wire tracks by the dashed and dotted lines. However, a greater plurality of wire thicknesses, e.g., five to ten different thicknesses can be accommodated. As semiconductor technology advances, geometric features have become increasingly smaller. Consequently, as these features get smaller, the fabrication processes get more and more complicated, reaching physical limits. As this happens, additional rules on the design process are added to make the more complicated manufacturing processes possible. In SADP, some of the additional rules have to do with the placement of different wire thicknesses only in the allowed, specified areas.

Figure 2:
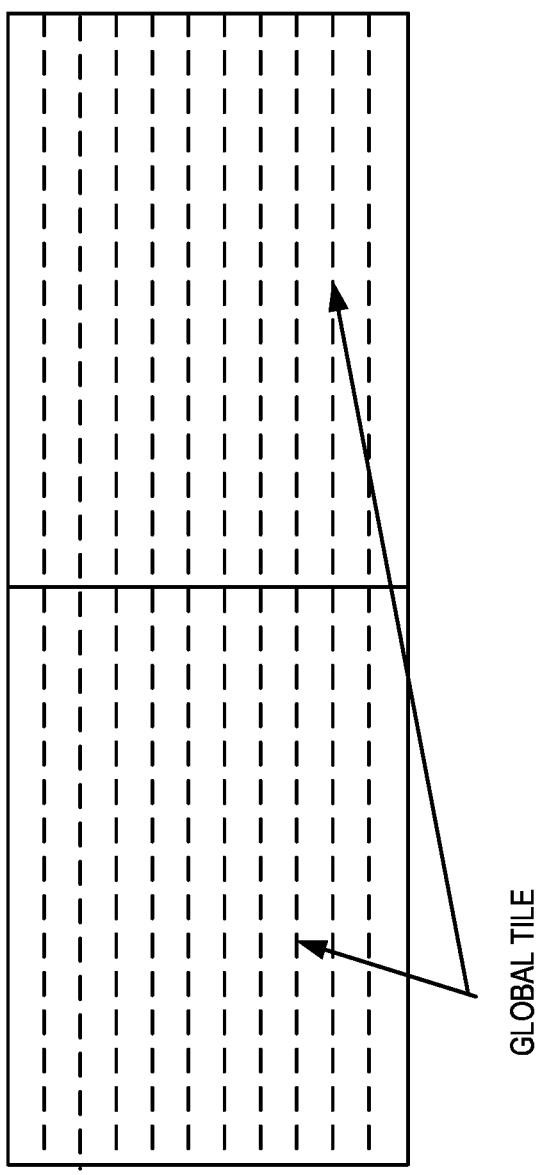
FIG. 2 is a top diagram depicting two adjacent global tiles in a circuit design showing the wiring tracks which are common between the two global tiles according to a first embodiment of the invention.

FIG. 2 is a top diagram depicting two adjacent global tiles in a circuit design showing the wiring tracks which are common between the two global tiles according to a first embodiment of the invention. In a global router, a capacity model is used to route the wiring between devices. The capacity model is used to determine how many and of what of wires, e.g., what thicknesses, are available to route wires with a particular region of the integrated circuit. In embodiments of the invention, a 3D global routing graph is created. The global routing graph divides the chip into a set global tiles which represent the nodes in this graph. For ease in illustration, only two global tiles are shown, but in a typical circuit design there would be hundreds, if not thousands of global tiles created. Edges are created between neighboring tiles to represent the wiring capacity between the tiles. The capacity of a global routing edge is the estimated number of minimum width wires crossing boundary of two adjacent tiles.

Figure 3:
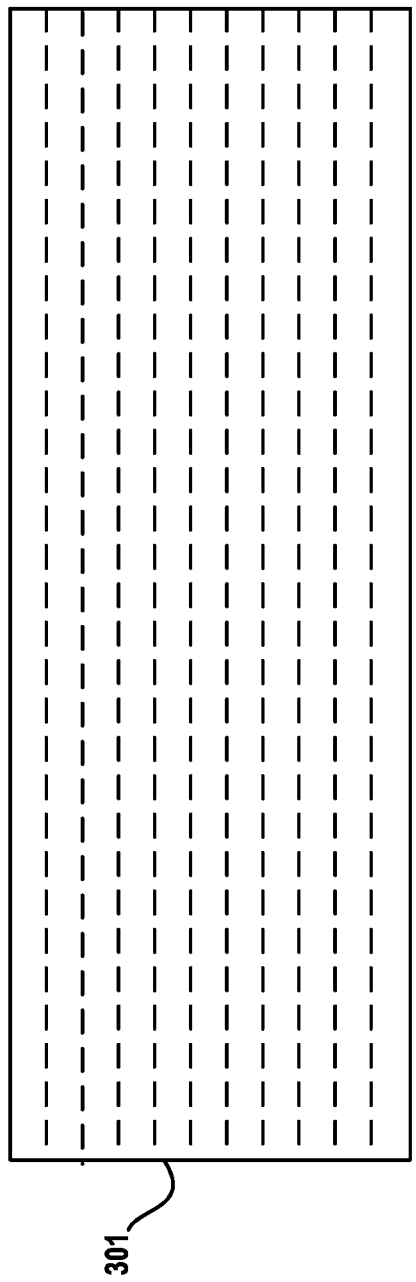
FIG. 3 is a top diagram depicting a first global tile having a set of single thickness wiring tracks and a second global tile having a set of double thickness wiring tracks each of which are disposed on a substrate according to a first embodiment of the invention.
Figure 3:
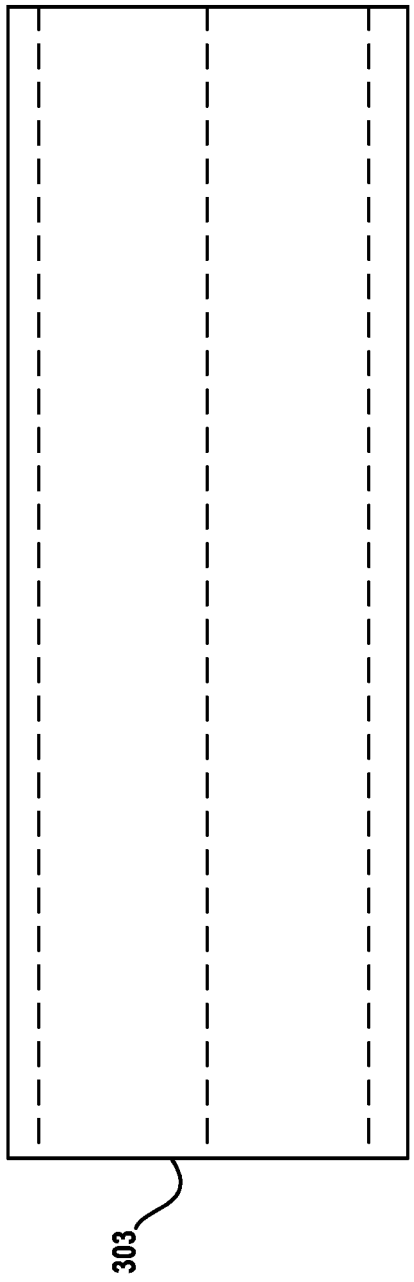

FIG. 3 is a top diagram depicting a first global tile 301 having a set of single thickness wiring tracks and a second global tile 303 having a set of double thickness wiring tracks each of which are disposed on a substrate according to a first embodiment of the invention. This diagram shows how wire track patterns on SADP tiles are segregated into areas within wiring layers. The track patterns are limited to regions and there is enough distance between all tracks such that all wire tracks of a given thickness could be used simultaneously. In the first global tile 301, only single width wire tracks are depicted, while in the second global tile 303, only double thickness tiles are shown. However, in other embodiments of the invention, the global tile can have separate single wire track and double track regions. The figure represents that in SADP different wiring patterns are specified in different regions of the chip.

There are two differences in the global routing for SADP technology compared to older prior art technologies. First, in SADP, the track patterns cannot be arbitrarily interleaved. It means the global router cannot arbitrarily put different type of track patterns anywhere in the design. Each region is assigned with specific track widths and track patterns (limited set of tracks). Second, the track patterns are non-overlapping. In SADP, the global router cannot use a 2× or 3× track thickness in the 1× wire routing track area. A 2× track can only occupy a designated 2× wire track area. For sake of simplicity, the increased width or non-minimum wires are often described in terms of an integer multiple of the minimum width wire. However, in alternative embodiments of the invention, the non-minimum width wires are non-integer multiples of the minimum width wire dimension.

Because the track patterns prescribe the exact number of minimum width wires and non-minimum width wires, a single capacity value is not used in embodiments of the invention. Instead, the global router models the wire capacity for every type of wire in the design separately. To model edge capacity for an SADP layer, the global router assigns each global routing edge an edge capacity consisting of two or more numbers. Each number represents the capacity of minimum width and increased width wires.

Example:

For wires with respective widths of w1, w2, . . . and having a respective count of n1, n2, . . . , the wiring capacity can be modelled in a vector as: "w1n1w2n2 . . . ". Wherein elements of the vector represent a respective edge capacity of a respective wire track thickness. If an edge is crossed by two types of wire tracks (e.g., single width wires (denoted by "s") and double width (denoted by "d") with respective counts of "x" and "y", the edge capacity would be expressed as the vector "sxdy". In embodiments of the invention with greater types of increased width wires, the global routing model is extended to have vectors with additional elements to represent each type of increased width wire track. For example, where single width, double width and triple width wire tracks are available, a capacity is expressed as vector "sxdytz". Other ways of representing the vector, for example, where the places of the respective widths are known by the global router and only the respective count is included, e.g., "n1n2 . . . " or "n1, n2, n3" are used in alternative embodiments. One skilled in the art, will recognize that wire widths in incremental widths rather than exact multiple widths are also used in circuit designs. In such an alternative embodiment, "a" represents the single, minimum width thickness, while "b" represents the 1.5 multiple of the minimum wire thickness and "c" represents the 1.75 multiple of the minimum wire thickness and the vector maybe expressed as "axbycz . . . ". The higher thickness wires such as double, triple or other multiples of the single, minimum wire thickness are called non-minimum thickness wires by the disclosure of this application.

Figure 4:
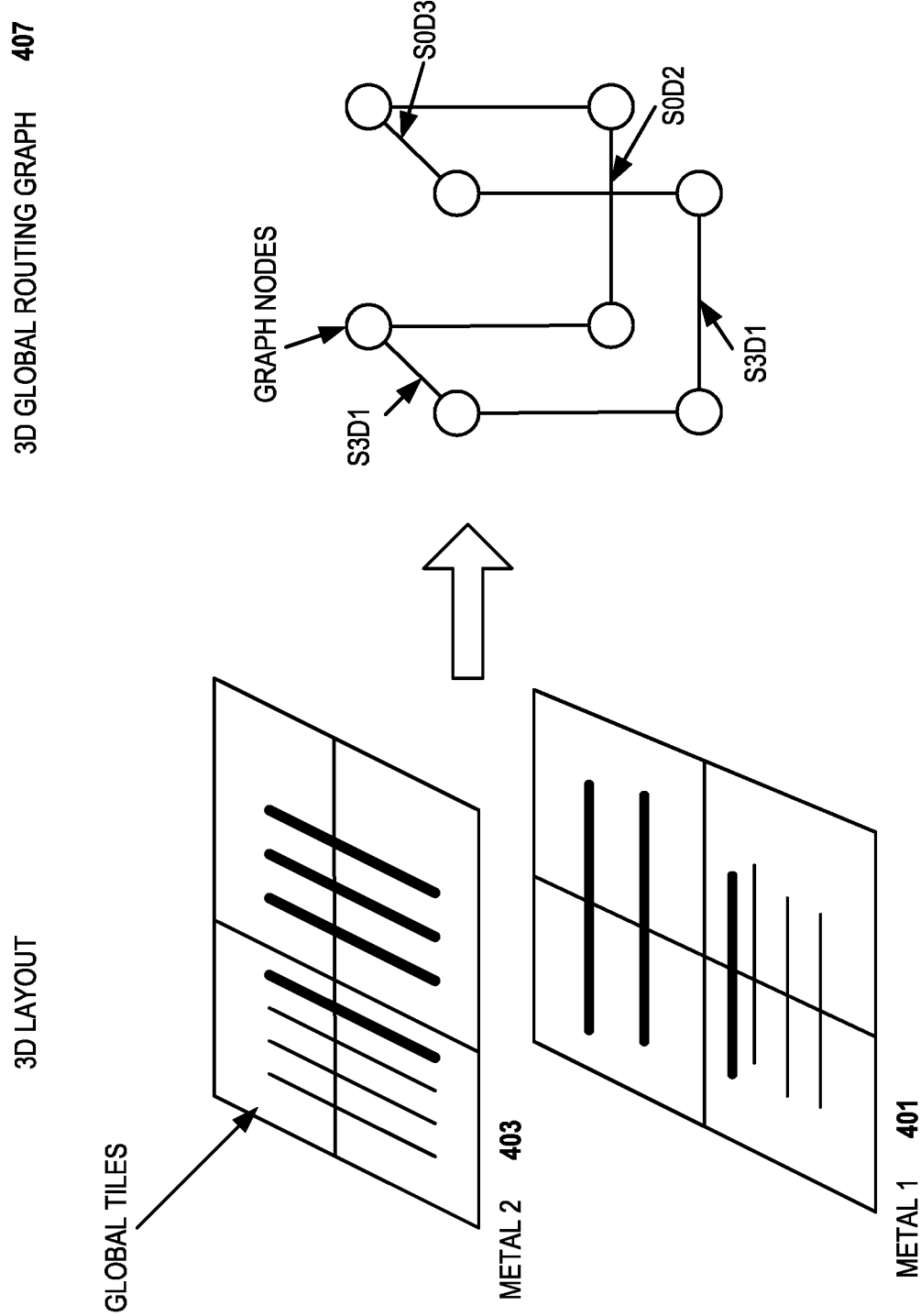
FIG. 4 is a diagram depicting a first set of wires in a first metal layer divided into a first set of global tiles and a second set of wires in a second metal layer divided into a second set of global tiles on the substrate and how the wire capacity crossing global tiles is modelled according to a first embodiment of the invention.

FIG. 4 is a diagram depicting a first set of wire tracks in a first metal layer divided into a first set of global tiles and a second set of wire tracks in a second metal layer divided into a second set of global tiles on the substrate. How the wire track capacities crossing global tiles are modelled according to a first embodiment of the invention is discussed with reference to the drawing. Note that the wire tracks and wire track regions are greatly simplified for ease in illustration and that many more wire tracks would be present in a typical global tile. A typical tile size for a global tile contains about 70×70 single width tracks. Within a global tile, there can be a set of regions wherein each region has wires of a particular width. If the number of regions is based on power wires, since there is a power wire every couple of tracks, after which a new region can begin, about 10 regions per tile could be accommodated.

In the left side of the drawing, a first metal layer 401 is shown with wire tracks crossing the global tiles horizontally and a second metal layer 403 is shown with the wire tracks crossing vertically. In the first metal layer 401, two double width wire tracks cross the upper two global tiles and a double width wire track and three single width wire tracks cross the lower two global tiles. In the second metal layer 403, a double width wire track and three single width wire tracks cross the left two global tiles and three double width wire tracks cross the right global tiles. One skilled in the art will appreciate that the "first" and "second" metal layers depicted in the drawing are not necessarily the metal layers closest to the device layers in the substrate, but merely representative metal layers.

In the right side of the drawing, the 3D global routing graph 407 is depicted. The graph nodes represent the global tiles and the interconnecting lines represent the edges which are used to represent the wiring capacity between global tiles. As shown, the vector S3D1 is used to represent the wiring capacity between the left global tiles in the second metal level 403 as three single width wire tracks and a double width wire track cross between these tiles. The vector S0D3 is used to represent the wiring capacity between the right global tiles in the second metal level 403 as zero single width wire tracks and three double width wire tracks cross between these tiles. Similarly, the vectors S0D2 and S3D1 respectively represent the wiring capacities between the upper global tiles and lower global tiles in the first metal level 401.

In the 3D global routing graph 407, the vertical lines represent the wiring capacities of the vias between first and second metal layers represented by the global tiles. The values and vectors for these wiring capacities are discussed below in association with FIGS. 5 and 6. As shown, there are no edges between the upper and lower global tiles in the second metal layer or between the left and right global tiles in the first metal layer as no wire tracks cross between these sets of tiles. In alternative embodiments, a vector such as S0D0 can represent the absence of wiring capacity between respective global tiles.

Figure 5:
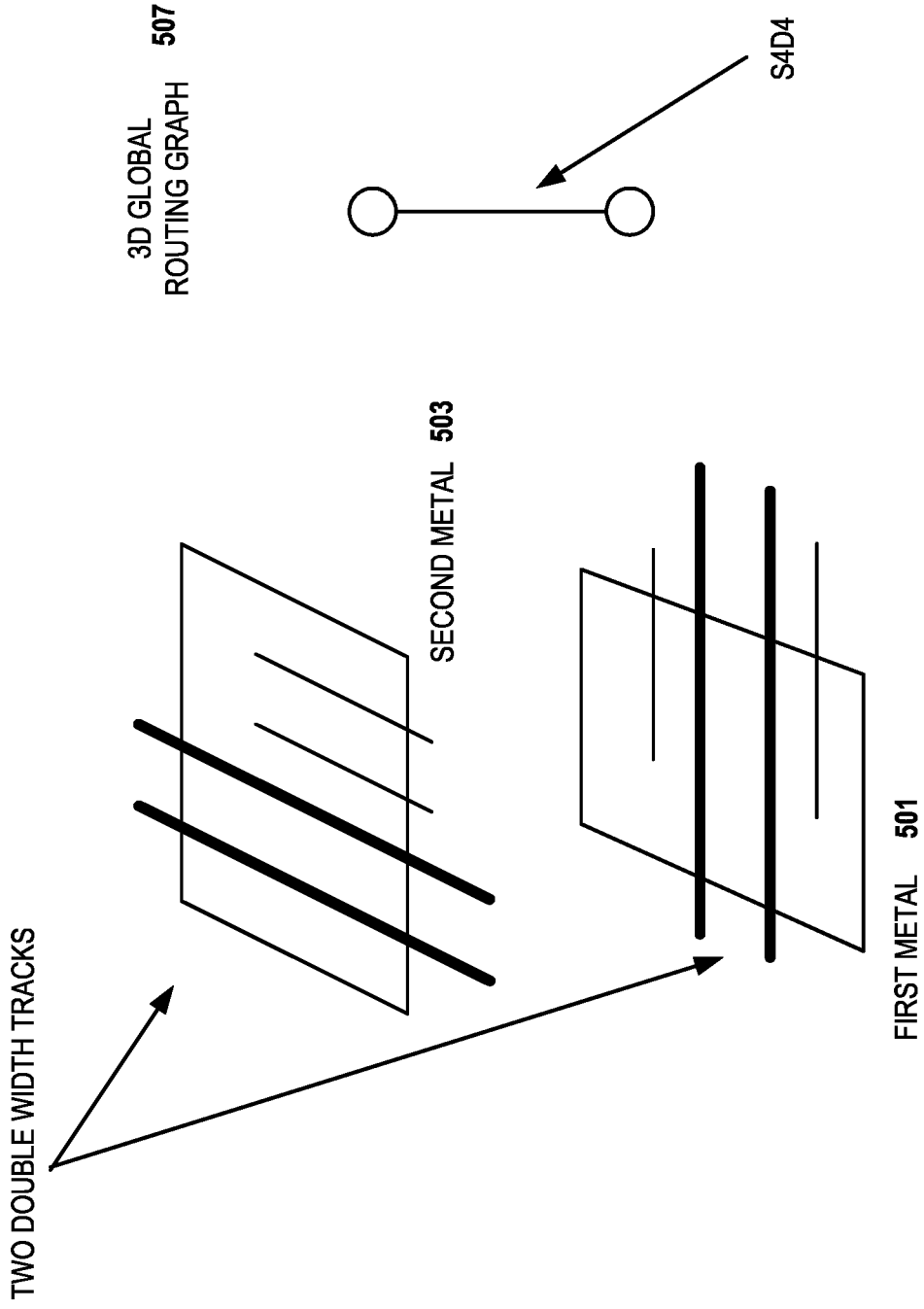
FIG. 5 is a diagram depicting a first set of wires in a first metal layer in a first global tile and a second set of wires in a second metal layer in a second global tile on the substrate and how the via capacity between the first and second global tiles is modelled according to a first embodiment of the invention.

FIG. 5 is a diagram depicting a first set of wire tracks in a first metal layer in a first global tile and a second set of wire tracks in a second metal layer in a second global tile on the substrate. How the via capacity between the first and second global tiles is modelled according to a first embodiment of the invention is discussed with reference to this figure. Similar to wire tracks between global tiles, there is a discrete number of via stacks between the SADP metal layers. The invention addresses the problem of determining how many via stacks there are in an area, e.g., between two global tiles. In other words, the goal of modeling in the global routing process is to find the wiring capacity of each type of via stack between global tiles.

The drawing shows two double width wire tracks and two single width wire tracks oriented horizontally in the global tiles in the first level metal 501 and two double width wire tracks and two single width wire tracks oriented vertically in the global tiles in the second level metal 503. The capacity for edges in z-dimension (number of vias) for a given width is the product of the number of tracks for this width on the corresponding lower layer tile and on the upper layer tile (if spacing rules permit use of all of these vias simultaneously). In this example, there are two single width wire tracks on each level, resulting in four single width vias (2×2=4) and two double width wire tracks on each level, resulting in four double width vias. Like the edges within a layer as discussed above, the wiring capacity can be represented by a vector, in this case, S4D4.

Figure 6:
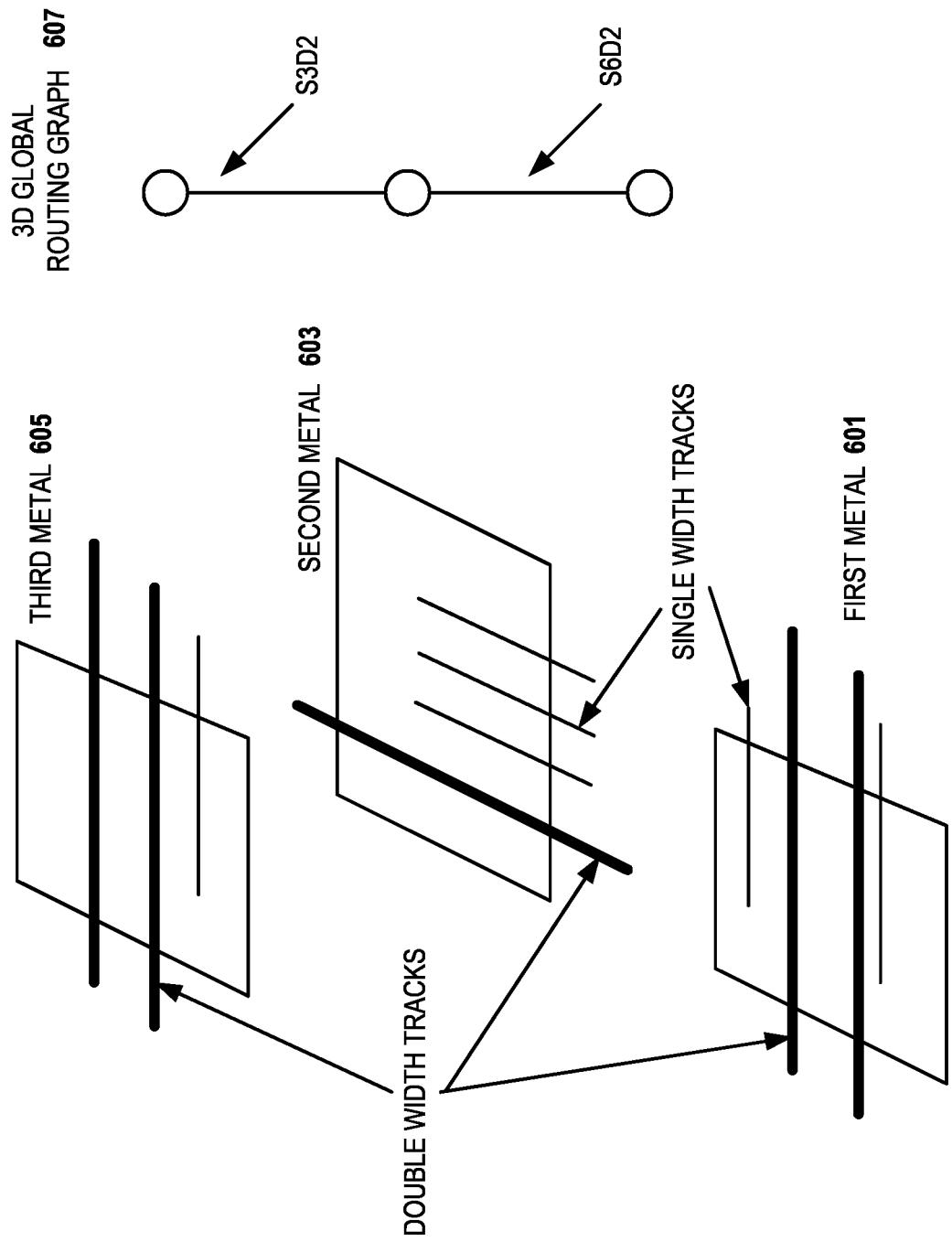
FIG. 6 is a diagram depicting a first set of wires in a first metal layer in a first global tile, a second set of wires in a second metal layer in a second global tile and a third set of wires in a third metal layer in a second global tile on the substrate and how the via capacity between the first, second and third global tiles is modelled according to a first embodiment of the invention.

FIG. 6 is a diagram depicting a first set of wire tracks in a first metal layer in a first global tile, a second set of wire tracks in a second metal layer in a second global tile and a third set of wire tracks in a third metal layer in a third global tile on the substrate. The drawing depicts how the via capacity between the first, second and third global tiles is modelled according to a first embodiment of the invention. The via capacity is determined in the same way as discussed above in reference to FIG. 5. The first global tile in the first metal level 601 has two single width wire tracks and two double width wire tracks; the second global tile in the second metal level 603 has three single width wire tracks and one double width wire track. Thus, the via capacity between the two layers is six single width vias (2×3=6) and two double width vias (2×1=2). In one embodiment of the invention, this is expressed by the vector S6D2.

To determine the via capacity between the second global tile in the second metal layer 603 and third global tile in the third metal layer 605, the global router starts with three single width wire tracks and one double width wire track in the second global tile in the second metal level 603 and the one single width wire track and two double width wire tracks in the third global tile in the third metal level 605. The via capacity between the two layers is three single width vias (3×1=3) and two double width vias (2×1=2). In one embodiment of the invention, this is expressed by the vector S3D2. Note that the via capacity between layers will vary according to the wire tracks present on adjacent layers and may be different between different sets of layers for the same global tile.

Figure 7:
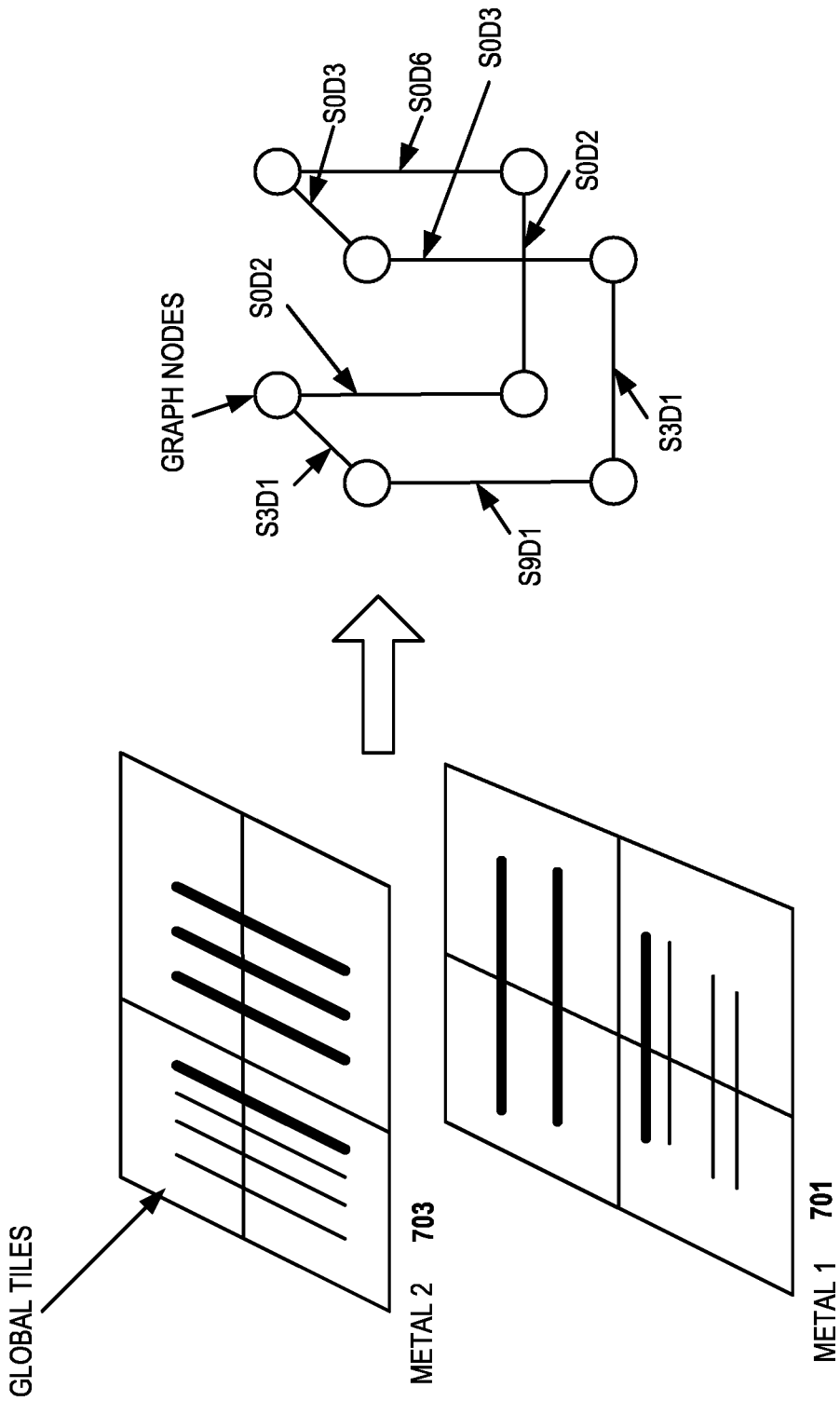
FIG. 7 is a diagram depicting a first set of wires in a first metal layer divided into a first set of global tiles and a second set of wires in a second metal layer divided into a second set of global tiles on the substrate and how the wire capacity crossing global tiles in the same metal level and between global tiles in different metal layers is modelled according to a first embodiment of the invention.

FIG. 7 is a diagram depicting how the wire track capacity crossing global tiles in the same metal level and between global tiles in different metal layers is modelled according to a first embodiment of the invention. The drawing is similar to that in FIG. 4 except that vectors for both inter-level via capacities and intra-level wire track capacities are shown. A first set of wire tracks in a first metal layer 701 divided into a first set of global tiles and a second set of wire tracks in a second metal layer 703 are divided into a second set of global tiles on the substrate.

In the 3D global routing graph 707, on the right hand side of the drawing, the vector representing the via capacity between the lower left global tiles in the first and second metal layers is S9D1 as there are three single width wire tracks in both global tiles (3×3=9) and one double width wire track in each global tile. (1×1=1). Similarly, the vector representing the via capacity for the upper left global tiles is S0D2 as there are three single width wire tracks in the upper global tile, but no single width wire track in the lower global tile (3×0=0) and one double width wire track in the upper global tile and two double width wire tracks in the lower global tile. (1×2=2). The vector for the upper right global tiles is S0D6 and that for the lower right global tiles is S0D3.

Figure 8:
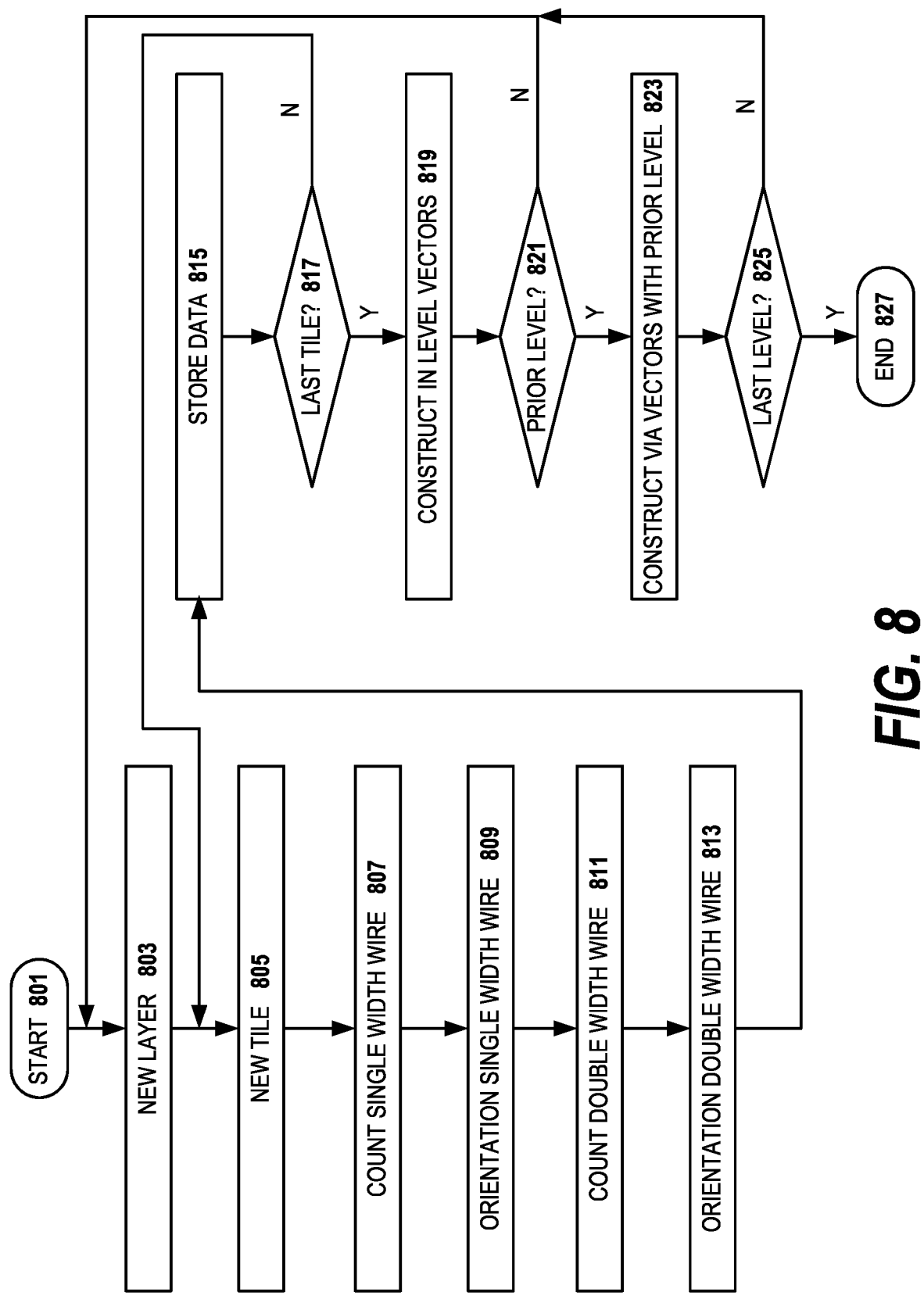
FIG. 8 is a flow diagram illustrating a method for determining the wiring capacity crossing global tiles in the same metal level and between global tiles in different metal layers is modelled according to a first embodiment of the invention.

FIG. 8 is a flow diagram illustrating a method for determining the wiring capacity crossing global tiles in the same metal level and between global tiles in different metal layers according to a first embodiment of the invention. The inputs to the global router are the global tiles and the track patterns. Track patterns may be determined by earlier steps of the physical design flow, e.g., after track placement based on the locations of certain circuits. A track pattern is a set of routing wire tracks where each routing wire track is annotated with a width that wires must have which use this wire track. The process starts with a wiring plan input, step 801. Next, the global router starts with a new layer. In preferred embodiments, the global router begins with a lowest metal layer and works its way to the highest level of the design. Next, in step 805, the next global tile is selected. In step 807, the number of single width wire tracks are counted. The orientation of the single width wire tracks is determined in step 809. The combination of steps 807 and 809 are used determine the number of single width wire track capacity and the edges which the single width wire track capacity is shared. In the embodiment shown, all of the in-level vectors are calculated in a single step (819), but in alternative embodiments, they can be calculated on as the wiring characteristics of the tile is determined.

In step 811, the number of double width wire tracks is counted; in step 813, the orientation of the double width wire tracks is determined. In embodiments of the invention, the number of single, double or other width wires can be different. The number or wire tracks depends on the underlying circuits and their pins. Circuits with wide pins might need wider wires and a track pattern with a sufficient amount of wide tracks should be in that area. In other areas, only minimum width wires may be sufficient. In step 815, the global tile data is stored.

Step 817 determines whether the present tile is the last tile in the current level. If not, the method returns to step 805. If the present tile is the final tile in the level, the in-level vectors are constructed for the edges used by the 3D global routing graph in step 819.

Next, the global router determines whether there is data for a prior level, step 821. If the present level is the first metal level, the method will return to step 803 to start with the next level. Otherwise in step 823, the inter-level vectors are constructed representing the via capacities between respective global tiles in the present and prior metal levels. As described above, in embodiments of the invention, the model to define capacities for stacked vias in SADP technology computes the product of number of tracks for the particular width on a lower layer which connects to the present layer.

The global router determines whether the present level is the last level in step 825. If not, the process returns to step 803. If the present level is the last level, the process ends, step 827. The wire track and via capacities are part of a capacity estimation phase of the global routing phase so that the detail router can provide the detailed circuit design in subsequent process steps. Next, the global routing phase embeds all the global nets in the global routing graph for the global tiles according to the wire track and via capacities. Because the respective wire track widths for all of the regions are established separately, when the global router lays a wire in a particular region in a particular global tile, it will be the correct wire width. In the prior art, the global router only used a single width wire track when making routing decisions. The detailed routing phase then computes the actual wires for each net inside the wire tracks in the global routing tiles produced by the global router.

Although the illustrated embodiment determines the single and double width wire tracks and single and double width vias on a level by level basis, alternative embodiments determines all the single width wire tracks for all levels (or at least all widths of the wiring levels of interest), then determines all the double width wire tracks for all levels, then all the single width vias for all levels and then all the double width vias for all levels. Also, as mentioned above, in other embodiments of the invention, there are more than two types of wire track thickness, so in those embodiments, there would be more passes in the process to account for the additional wire track thicknesses. In the invention, it is important that the wire track capacities and via capacities for each respective thickness are determined and recorded separately.

The resulting wire capacities and via capacities can be used in a variety of applications such as congestion estimation, global routing solutions, path search optimization and congestion driven placement optimization. In congestion estimation, regions of high interconnection density are identified based on the wire capacities and the demand for the wire capacity in respective regions. Congestion driven placement optimization is used to relocate high density wiring patterns in the global routing step, thereby reducing the running time of the routing tools in the detail routing phase.

Figure 9:
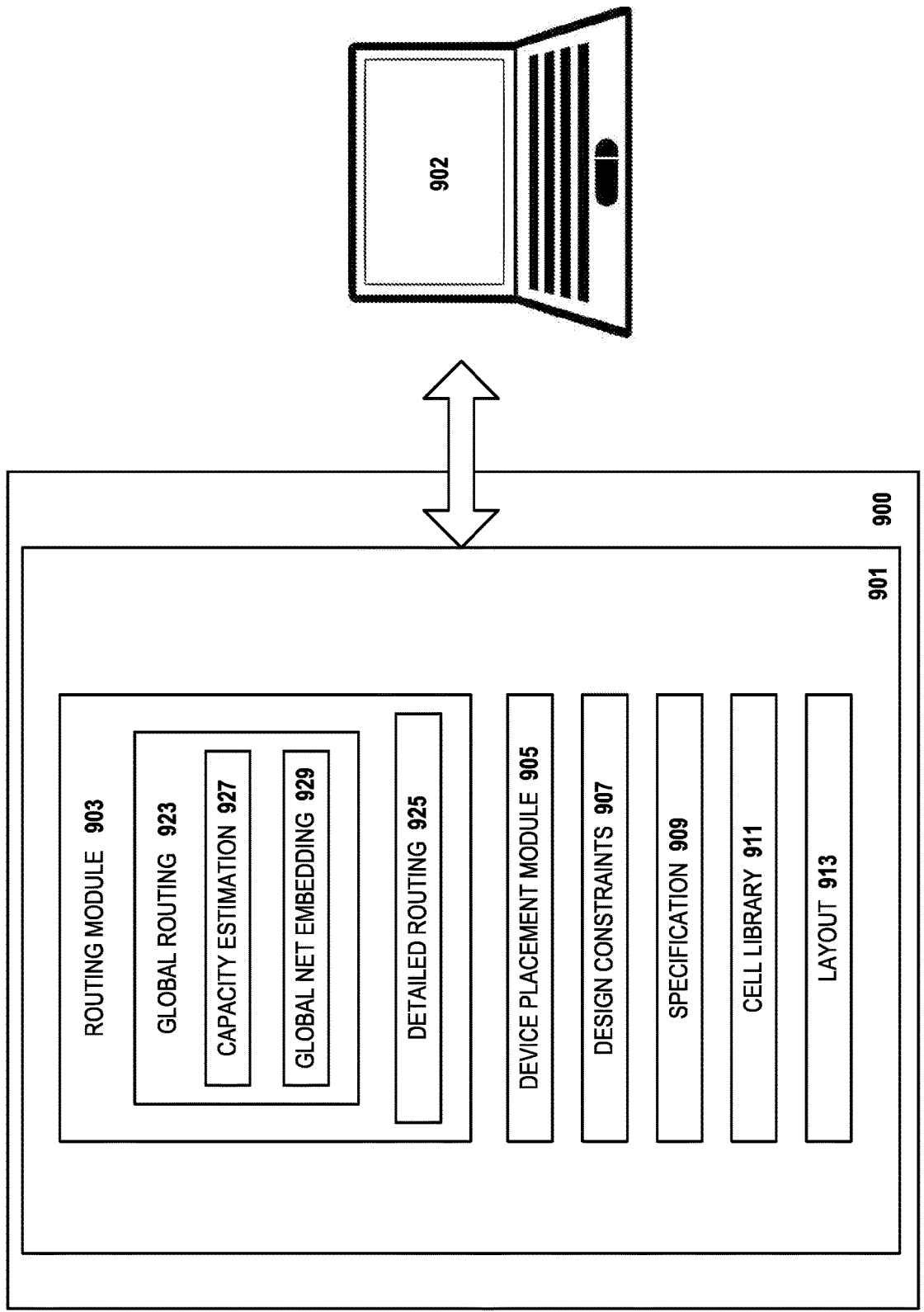
FIG. 9 is a diagram which a general architecture of an EDA system to perform global routing according to some embodiments of the invention.

FIG. 9 is a diagram which a general architecture for using a system to perform routing for semiconductor technologies which use multiple width patterning according to some embodiments of the invention. EDA tool 900 includes a computer memory 901 which includes a plurality of logic and data modules. A user interacts with the EDA tool using a user terminal 902 such as personal computer or workstation. A routing module 903 is used to route an electronic design to generate a layout 913. The routing module 903 uses one or more design specifications 909 and one or more design constraints 907 to generate the layout. A device placement module 905 is used to place the devices in the integrated circuit. The design constraints 907 may include one or more constraints that are imposed to guarantee the ability to generate mask designs that are capable of manufacturing the routed layout 913. One or more cell libraries 911 may contribute cells that are routed by wire tracks in the layout 913. One or more users may operate EDA tool 900 using one or more user terminals 902. The one or more user terminals 902 may include a display device for displaying visual information during the operation of EDA tool 900 or to display the results of operating the EDA tool, e.g., to display layout 913.

In one preferred embodiment, the routing module 903 comprises of a separate global routing module 923 and a separate detailed routing module 925. Within the global routing module 923, the chip area is first partitioned into global tiles. The capacities in terms of wiring between adjacent global tiles is estimated by the capacity estimation module 927. The global routing module then embeds all nets in the global routing graph created by the global tiles based on the capacities in the global wire net embedding module 929. The detailed routing module 925 then computes the actual wires for each net inside the wire tracks created by the global routing tiles used by the global router module 923. Embodiments of the invention, are embodied in the capacity estimation module 927 for SADP layer global routing where traditional methods have major flaws for SADP technology.

Figure 10:
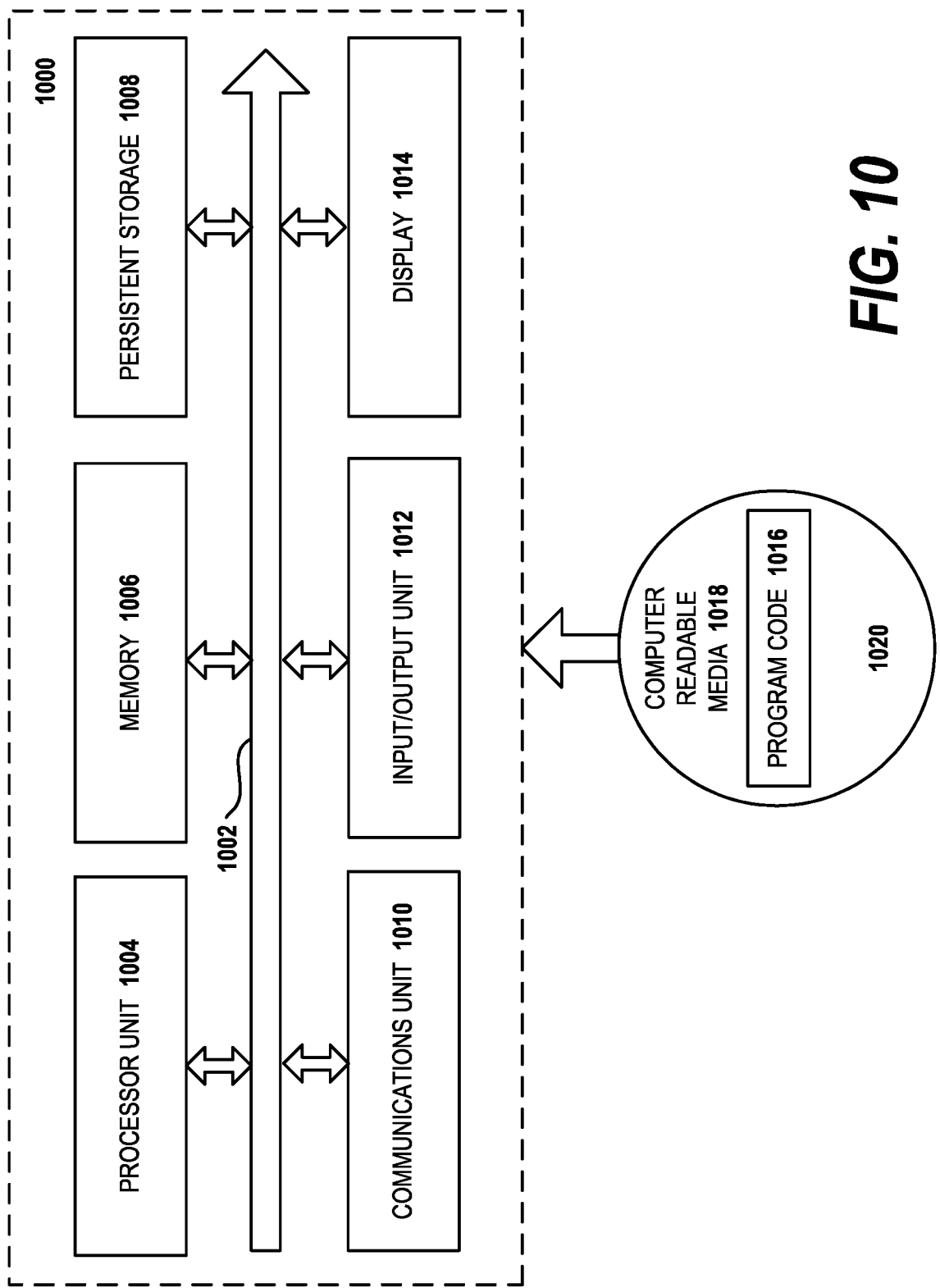
FIG. 10 is an exemplary block diagram of a data processing system in which exemplary aspects of the illustrative embodiments may be implemented.

With reference now to FIG. 10, a block diagram of an exemplary data processing system is shown in which aspects of the illustrative embodiments may be implemented. Data processing system 1000 is an example of a computer, such as user terminal 902 or EDA tool 900 in FIG. 9, in which computer usable code or instructions implementing the processes for illustrative embodiments of the disclosure may be located.

With reference now to FIG. 10, a block diagram of a data processing system is shown in which illustrative embodiments may be implemented. Data processing system 1000 is an example of a computer in which computer-usable program code or instructions implementing the processes may be located for the illustrative embodiments. In this illustrative example, data processing system 1000 includes communications fabric 1002, which provides communications between processor unit 1004, memory 1006, persistent storage 1008, communications unit 1010, input/output (I/O) unit 1012, and display 1014.

Processor unit 1004 serves to execute instructions for software that may be loaded into memory 1006. Processor unit 1004 may be a set of one or more processors or may be a multi-processor core, depending on the particular implementation. Further, processor unit 1004 may be implemented using one or more heterogeneous processor systems in which a main processor is present with secondary processors on a single chip. As another illustrative example, processor unit 204 may be a symmetric multi-processor (SMP) system containing multiple processors of the same type.

Memory 1006 and persistent storage 1008 are examples of storage devices. A storage device is any piece of hardware that is capable of storing information either on a temporary basis and/or a permanent basis. Memory 1006, in these examples, may be, for example, a random access memory or any other suitable volatile or non-volatile storage device. Persistent storage 1008 may take various forms depending on the particular implementation. For example, persistent storage 1008 may contain one or more components or devices. For example, persistent storage 1008 may be a hard drive, a flash memory, a rewritable optical disk, a rewritable magnetic tape, or some combination of the above. The media used by persistent storage 1008 also may be removable. For example, a removable hard drive may be used for persistent storage 1008.

Communications unit 1010, in these examples, provides for communications with other data processing systems or devices. In these examples, communications unit 1010 is a network interface card. Communications unit 1010 may provide communications through the use of either or both physical and wireless communications links.

Input/output unit 1012 allows for input and output of data with other devices that may be connected to data processing system 1000. For example, input/output unit 1012 may provide a connection for user input through a keyboard and mouse. Further, input/output unit 1012 may send output to a printer. Display 1014 provides a mechanism to display information to a user.

Instructions for the operating system and applications or programs are located on persistent storage 1008. These instructions may be loaded into memory 1006 for execution by processor unit 1004. The processes of the different embodiments may be performed by processor unit 1004 using computer implemented instructions, which may be located in a memory, such as memory 1006. These instructions are referred to as program code, computer-usable program code, or computer-readable program code that may be read and executed by a processor in processor unit 1004. The program code in the different embodiments may be embodied on different physical or tangible computer-readable media, such as memory 1006 or persistent storage 1008.

Program code 1016 is located in a functional form on computer-readable media 1018 that is selectively removable and may be loaded onto or transferred to data processing system 1000 for execution by processor unit 1004. Program code 1016 and computer-readable media 1018 form computer program product 1020 in these examples. In one example, computer-readable media 1018 may be in a tangible form, such as, for example, an optical or magnetic disc that is inserted or placed into a drive or other device that is part of persistent storage 1008 for transfer onto a storage device, such as a hard drive that is part of persistent storage 1008. In a tangible form, computer-readable media 1018 also may take the form of a persistent storage, such as a hard drive, a thumb drive, or a flash memory that is connected to data processing system 1000. The tangible form of computer-readable media 1018 is also referred to as computer-recordable storage media. In some instances, computer-recordable media 1018 may not be removable.

Alternatively, program code 1016 may be transferred to data processing system 1000 from computer-readable media 1018 through a communications link to communications unit 1010 and/or through a connection to input/output unit 1012. The communications link and/or the connection may be physical or wireless in the illustrative examples. The computer-readable media also may take the form of non-tangible media, such as communications links or wireless transmissions containing the program code. The different components illustrated for data processing system 1000 are not meant to provide architectural limitations to the manner in which different embodiments may be implemented. The different illustrative embodiments may be implemented in a data processing system including components in addition to or in place of those illustrated for data processing system 1000. Other components shown in FIG. 10 can be varied from the illustrative examples shown. As one example, a storage device in data processing system 1000 is any hardware apparatus that may store data. Memory 1006, persistent storage 1008, and computer-readable media 1018 are examples of storage devices in a tangible form.

In another example, a bus system may be used to implement communications fabric 1002 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 1006 or a cache such as found in an interface and memory controller hub that may be present in communications fabric 1002.

Although in the illustrative embodiment, only single width and double width wire tracks and their wire capacities are determined, in alternative embodiments having a greater number of different wire track widths, each of the wire track width capacities for each wire track width are determined.

The global and detail routing are part of the physical design of the integrated circuit. Once the positions of the wires and nets have been established in the routing process, post wiring optimizations for timing, noise and yield are performed. The final design is checked to make sure that the mapping to the logic design was performed correctly and that the particular manufacturing rules for the process intended to make the integrated circuit were followed. Tapeout and mask generation follow where the wiring design is turned into photomasks in a mask data preparation process.

The resulting design can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for determining edge capacities of global tiles by a global router for a first integrated circuit, comprising:
    determining respective edge capacities of first width wire tracks and second width wire tracks for each of a plurality of global tiles in the first metal layer in the first integrated circuit;
    determining respective via capacities of third width vias and fourth width vias for each of the plurality of global tiles in the first metal layer in the first integrated circuit, wherein the third and fourth width vias capacities represent vias which electrically connect a first metal layer to a second metal layer;
    wherein first and second width edge capacities for wire tracks and third and fourth width via capacities for vias are determined in separate operations; and
    causing the first integrated circuit to be fabricated at least in part based on the determined first and second width wire track edge capacities and the determined third and fourth width via capacities.

2. The method as recited in claim 1, wherein respective via capacities for vias between respective metal layers are computed as the product of a number of wire tracks of a respective width in a global tile in the first metal layer and a number of wire tracks of the respective width in a global tile in the second metal layer.

3. The method as recited in claim 1, wherein a respective edge capacity of the first width wire tracks and the second width wire tracks between a first global and a second global tile in the first metal layer are represented in a vector; wherein the first width wire is a minimum wire track width and wherein the second width wire is a non-minimum wire track width.

4. The method as recited in claim 3, wherein the non-minimum width wire tracks comprise a plurality of different non-minimum width wire track widths, and the method further comprises:
    determining a respective edge capacity of each of the non-minimum width wire track widths for each of the plurality of global tiles in the first metal layer in the first integrated circuit; and
    wherein edge capacities for each of the non-minimum width wire track widths are determined in separate operations.

5. The method as recited in claim 3, wherein the global router receives a track pattern for the global tiles and the method further comprises, by a detailed routing module, placing a set of detail wires for each net of the plurality of nets inside the minimum width and non-minimum width wire tracks in the global routing tiles in the first metal layer.

6. The method as recited in claim 1, wherein the edge capacities are determined for the first metal layer before repeating the determining for a second metal layer.

7. The method as recited in claim 1, further comprising embedding a plurality of nets in a global routing graph based on the determined edge and via capacities.

8. A computer readable memory storing a control program for controlling a global router for determining edge capacity of global tiles in a first integrated circuit, said control program causing a processor to perform the method comprising:
- determining respective edge capacities of first width wire tracks and second width wire tracks for each of a plurality of global tiles in the first metal layer in the first integrated circuit;
- determining respective via capacities of third width vias and fourth width vias for each of the plurality of global tiles in the first metal layer in the first integrated circuit, wherein the third and fourth width vias capacities represent vias which electrically connect a first metal layer to a second metal layer;
- wherein first and second width edge capacities for wire tracks and third and fourth width via capacities for vias are determined in separate operations; and
- causing the first integrated circuit to be fabricated at least in part based on the determined first and second width wire track edge capacities and the determined third and fourth width via capacities.

9. The computer readable memory as recited in claim 8, wherein respective via capacities for vias between respective metal layers are computed as the product of a number of wire tracks of a respective width in a global tile in the first metal layer and a number of wire tracks of the respective width in a global tile in the second metal layer.

10. The computer readable memory as recited in claim 8, wherein a respective edge capacity of the first width wire tracks and the second width wire tracks between a first global and a second global tile in the first metal layer are represented in a vector; wherein the first width wire is a minimum wire track width and wherein the second width wire is a non-minimum wire track width.

11. The computer readable memory as recited in claim 10, wherein the non-minimum width wire tracks comprise a plurality of different non-minimum width wire track widths, and the method further comprises:
- determining a respective edge capacity of each of the non-minimum width wire track widths for each of the plurality of global tiles in the first metal layer in the first integrated circuit; and
- wherein edge capacities for each of the non-minimum width wire track widths are determined in separate operations.

12. The computer readable memory as recited in claim 10, wherein the global router receives a track pattern for the global tiles and the method further comprises, by a detailed routing module, placing a set of detail wires for each net of the plurality of nets inside the minimum width and non-minimum width wire tracks in the global routing tiles in the first metal layer.

13. Apparatus, comprising:
- a processor;
- a computer memory holding computer program instructions executed by the processor for controlling a global routing operation for determining edge capacity of global tiles in a first integrated circuit, the computer program instructions when executed carrying out the actions comprising:
  - determining respective edge capacities of first width wire tracks and second width wire tracks for each of a plurality of global tiles in the first metal layer in the first integrated circuit;
  - determining respective via capacities of third width vias and fourth width vias for each of the plurality of global tiles in the first metal layer in the first integrated circuit, wherein the third and fourth width vias capacities represent vias which electrically connect a first metal layer to a second metal layer;
  - wherein first and second width edge capacities for wire tracks and third and fourth width via capacities for vias are determined in separate operations; and
  - causing the first integrated circuit to be fabricated at least in part based on the determined first and second width wire track edge capacities and the determined third and fourth width via capacities.

14. The apparatus as recited in claim 13, wherein the actions further comprise determining respective via capacities for vias between respective metal layers from the product of a number of wire tracks of a respective width in a global tile in the first metal layer and a number of wire tracks of the respective width in a global tile in the second metal layer.

15. The apparatus as recited in claim 14, wherein a respective edge capacity of the first width wire tracks and the second width wire tracks between a first global and a second global tile in the first metal layer are represented in a vector; wherein the first width wire is a minimum wire track width and wherein the second width wire is a non-minimum wire track width and wherein the non-minimum width wire tracks comprise a plurality of different non-minimum width wire track widths, and the actions further comprise:
- determining a respective edge capacity of each of the non-minimum width wire track widths for each of the plurality of global tiles in the first metal layer in the first integrated circuit; and
- wherein edge capacities for each of the non-minimum width wire track widths are determined in separate operations.

16. The apparatus as recited in claim 15, wherein the global router receives a track pattern for the global tiles and the method further comprises, by a detailed routing module, placing a set of detail wires for each net of the plurality of nets inside the minimum width and non-minimum width wire tracks in the global routing tiles in the first metal layer.

17. The apparatus as recited in claim 13, wherein the actions further comprise embedding a plurality of nets in a global routing graph of the first metal layer based on the determined edge and via capacities.

* * * * *